(12) United States Patent
Auer

(10) Patent No.: US 6,259,727 B1
(45) Date of Patent: Jul. 10, 2001

(54) PROCESS AND DEVICE FOR GENERATING A PLURALITY OF DERIVED CLOCK SIGNALS

(75) Inventor: Erich Auer, Besigheim (DE)

(73) Assignee: Bobert Bosch GmbH, Stuttgart (DE)

( * ) Notice: Subject to any disclaimer, the term of this patent is extended or adjusted under 35 U.S.C. 154(b) by 0 days.

(21) Appl. No.: 09/142,280

(22) PCT Filed: Oct. 23, 1996

(86) PCT No.: PCT/DE96/02032

§ 371 Date: Jan. 8, 1999

§ 102(e) Date: Jan. 8, 1999

(87) PCT Pub. No.: WO97/33374

PCT Pub. Date: Sep. 12, 1997

(30) Foreign Application Priority Data

Mar. 6, 1996 (DE) ................................ 196 08 666

(51) Int. Cl.$^7$ ................................ H04B 1/38; H04L 5/16
(52) U.S. Cl. .......................................... 375/222; 375/372
(58) Field of Search ................................ 375/222, 371, 375/372, 8, 363; 370/102, 505, 506

(56) References Cited

U.S. PATENT DOCUMENTS

| 4,095,053 | * | 6/1978 | Duttweiler et al. | 179/15 |
| 4,667,324 | * | 5/1987 | Graves | 370/102 |
| 4,928,275 | * | 5/1990 | Moore et al. | 370/102 |
| 5,200,976 | * | 4/1993 | Ishihara et al. | 375/8 |
| 5,502,750 | * | 3/1996 | Co et al. | 375/372 |
| 5,517,534 | * | 5/1996 | Knierim | 375/371 |

FOREIGN PATENT DOCUMENTS

| 39 19 530 | 12/1990 | (DE) . |
| 0 477 131 | 3/1992 | (EP) . |
| 0 492 588 | 7/1992 | (EP) . |
| 2 671 246 | 7/1992 | (FR) . |
| 6-132816 | 5/1994 | (JP) . |

* cited by examiner

Primary Examiner—Stephen Chin
Assistant Examiner—Tony Al-Beshrawi
(74) Attorney, Agent, or Firm—Kenyon & Kenyon

(57) ABSTRACT

A method and arrangements for extracting a plurality of clock signals for signal-processing circuits, in particular for a digital modem, from a supplied clock signal, for the clock signals to be extracted to be formed in each case from an output signal of an accumulator of predefined bit width n. The accumulator accumulates in each case an increment in the clock pulse of the supplied clock signal and, in the process, performs a modulo$2^n$ operation.

20 Claims, 3 Drawing Sheets

PROCESS AND DEVICE FOR GENERATING A PLURALITY OF DERIVED CLOCK SIGNALS

FIELD OF THE INVENTION

The present invention relates to a method and arrangements for extracting a plurality of clock signals for signal-processing circuits, especially for a digital modem, from a supplied clock signal.

BACKGROUND INFORMATION

For the digital generation and modulation of the carrier in modems, the sampling frequency $f_A$ in relation to the symbol frequency $f_s$ can be implemented in two ways. First of all, a fixed, integral ratio can be selected between the sampling frequency and the symbol frequency, so that the sampling is carried out in synchronous form. In addition, the sampling frequency must satisfy the sampling theorem, i.e. it must be greater than double as large (as a rule four times as large) as the symbol frequency. The synchronous sampling demands a is clock-pulse extraction, which extracts the sampling clock pulse from the symbol clock pulse by frequency division.

In the case of asynchronous sampling, the sampling frequency is predetermined independently of the symbol frequency. In general, the asynchronous sampling can operate with a free-running sampling clock pulse which is independent of the symbol clock pulse. In a comparison of the asynchronous with the synchronous sampling, it is significant, inter alia, that in the case of the asynchronous sampling, in spite of a variable symbol rate, a requisite anti-aliasing filter, because of the fixed sampling frequency, does not have to be designed to be variable. The asynchronous sampling requires a variable interpolation on the transmitting side and a variable decimation on the receiving side, respectively. A method for digital modulation and a digital modulator having asynchronous sampling, as well as variable interpolation and variable decimation, respectively, are described, for example, in the German Patent No. 39 19 530, and in the European Patent Application No. 0 477 131.

In such digital modems which, in addition to the actual modulator and demodulator, also contain various digital signal-processing circuits such as coders and decoders, various clock signals are needed which are adapted to the various bit rates of the signals to be transmitted between the individual circuits. In this context, the clock frequencies are only partially in a fixed, rational ratio, e.g. 48/73. To generate clock signals in such a frequency ratio, in known modems, frequency dividers and phase-comparison circuits are used which, for the most part, are realized using analog circuit technology.

The object of the present invention is to provide a method and arrangements for extracting a plurality of clock signals from a supplied clock signal, which can be implemented exclusively in digital circuit technology. At the same time, the intention is to ensure to the greatest extent possible a flexibility with regard to the symbol rate and the data rate.

SUMMARY OF THE INVENTION

This objective is fulfilled according to the present invention, in that the clock signals to be extracted are in each case formed from an output signal of an accumulator of predefined bit width n, the accumulator in each case accumulating an increment in the clock pulse of the supplied clock signal and, in the process, performing a modulo$2^n$ operation.

The method of the present invention can also be used in other signal-processing circuits than digital modems. To adapt a digital modem to the symbol rates required at any one time, the predefined value can in each case be programmed. To carry out the method, a special digital hardware is suitable which can be beneficially implemented, from the standpoint of outlay, in an FPGA (Field Programmable Gate Array) or in an ASIC (Application Specific Integrated Circuit).

However, particularly in the case of digital modems having asynchronous sampling, the problem arises that a second clock signal is supplied, namely a clock pulse that is rigidly coupled to the symbol clock pulse, but is not coupled to the supplied first clock signal. In order to avoid an error propagation in the form of clock-pulse slips resulting from this, in a further development of the method according to the present invention, a second clock signal is supplied, and the increment is changed as a function of the phase position of the second supplied clock signal in relation to one of the clock signals to be extracted.

This change can be carried out continuously or quasi continuously. However, to reduce the computing expenditure, in each case a plurality of predefined values for the increment can be stored in a memory, one of these values being selected, as a function of the phase position, as the increment to be accumulated. In this context, an adequate control response exists for many application cases if the increment to be accumulated is selected from three predefined values. In addition, a time adaptation of the three points of this three-step control is effected, in that there is a common divisor, and the three increments are free of remainders. Which specific embodiment of this further development is selected depends essentially on the respective demands for freedom from jitter.

It may be that this further development does not obviate a residual jitter of the extracted clock signals. However, this is generally not disturbing for the applications of the method according to the invention taken into consideration. Because of the generally relatively constant frequencies of the first and the second supplied clock signal, it is sufficient for this further development if the three predefined values differ from each other by, in each case, approximately 0.5%. In addition, this further development makes it possible for the predefined values to differ insignificantly from the theoretical values which result from the frequency ratios, so that the accuracy or the number of binary positions in the accumulators can be limited to practicable values.

To avoid the aforesaid error propagation, if the increment supplied at any one time to an accumulator is not remainder-free, provision can be made in the method of the present invention that a further accumulator having a predefined bit width m and a numerical range, capable of representation, of Z actual element of $[2^m-1.0]$, accumulates remainder values in the clock pulse of the first supplied clock signal, and that the respective content of the further accumulator, after modulo$2^m$ formation, is supplied to a carry-over input of the accumulator for the clock signal to be extracted in each case.

However, error propagation is also avoided if the increment supplied in each case to an accumulator is divisible, so as to be remainder-free, in the numerical range that is representable by the predefined bit width, by the largest common divisor of all the clock-pulse conversion ratios to be implemented.

Another embodiment of the method of the present invention is that at least one of the clock signals to be extracted is formed from the overflow of the respective accumulator.

However, in this case, it is necessary to put up with a certain remainder jitter.

Another embodiment of the method of the present invention permits jitter-free extraction of the clock signal to be extracted, in that at least one of the clock signals to be extracted is generated by sinusoidal formation of the accumulator content, digital/analog conversion, and zero-crossing detection.

The present invention also provides an arrangement for extracting clock signals in a digital modem, a digital signal to be transmitted being supplied via a plurality of signal-processing circuits, particularly coders, and via an intermediate memory, to a device for variable interpolation, from which a modulated carrier having a first supplied clock signal is able to be read out, and a second supplied clock signal being extracted from the digital signal, provision being made that, for the signal-processing circuits and for the readout process from the intermediate memory, clock signals are extracted in each case from an accumulator of a predefined bit width, the accumulator accumulating an increment in the clock pulse of the first supplied clock signal, and that the increments to be accumulated in each case are changed as a function of the phase position of the second supplied clock signal in relation to one of the extracted clock signals.

In addition to providing these measures for the transmitting section of a modem, they can also be provided in advantageous manner for the receiving section of a modem, in which case a received, modulated carrier is supplied to a device for variable decimation, the digital output signal of the device being able to be supplied via an intermediate memory and signal-processing circuits, particularly decoders, to an output, a first clock signal furthermore being supplied for the write-in process into the device for variable decimation, and a second supplied clock signal being extracted from the digital output signal of the device for variable decimation.

Provision is advantageously made in the arrangements according to the present invention that, in each case, a plurality of predefined values for the increment are stored in a memory, one of these values being selected, as a function of the phase position, as the increment to be accumulated. For a number of application examples, it is sufficient if the increment to be accumulated is selected from three predefined values.

DETAILED DESCRIPTION

Figure 1:
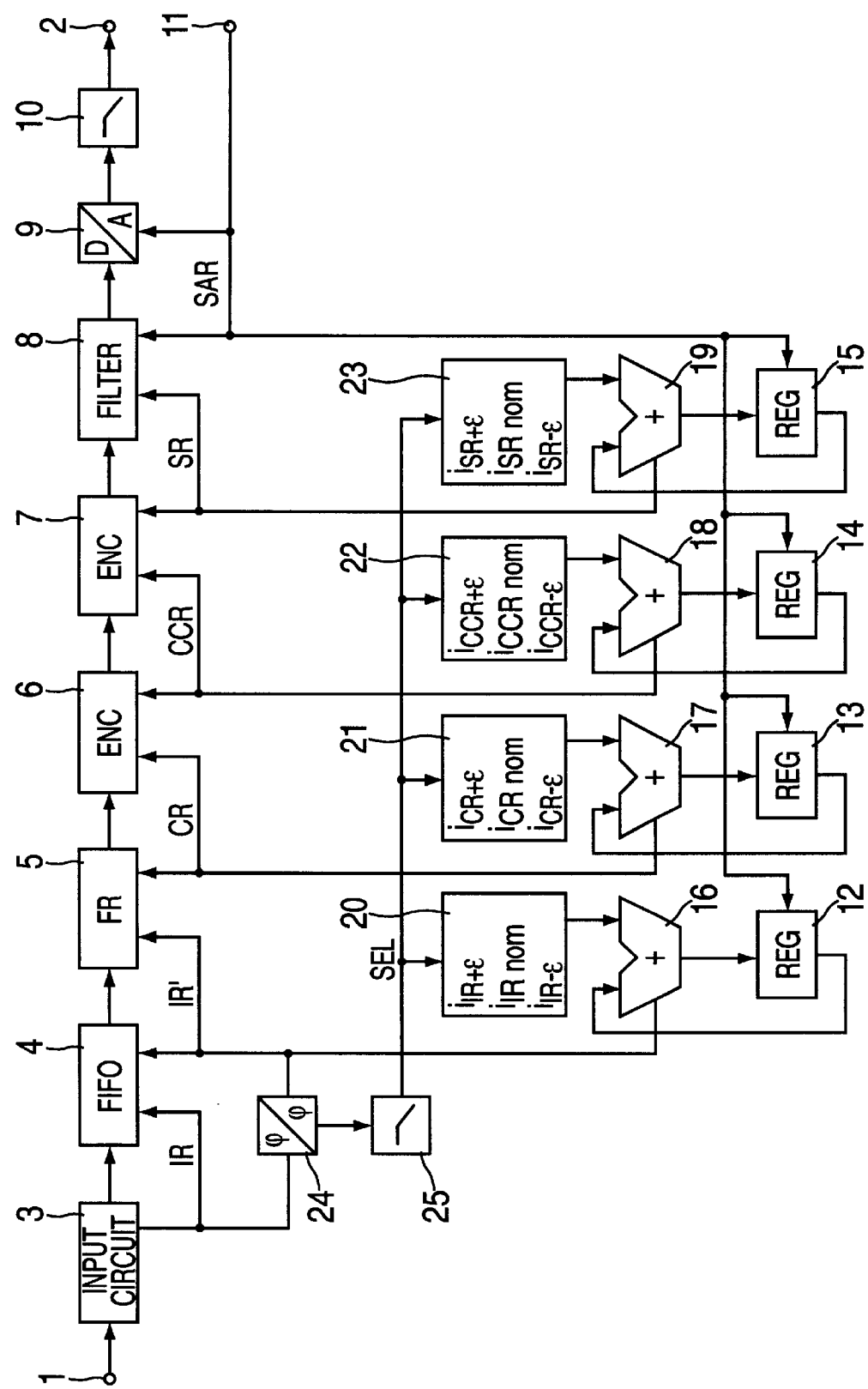
FIG. 1 shows an embodiment of the present invention associated with a transmitting-side section of a modem.

The exemplary embodiments according to the present invention are shown in FIGS. 1–4 as block diagrams. However, an arrangement for carrying out the method of the present invention is not limited to an implementation with the aid of individual circuits corresponding to the blocks. Rather, the arrangement can be implemented with highly integrated circuits.

A digital signal to be transmitted is supplied to an input 1 passes through a digital signal-processing system, including a digital modulator. The modulated carrier signal (e.g., a carrier-frequency rate signal) is then available at output 2. The signal-processing system includes an input circuit 3, in which the clock pulse IR contained in the digital signals supplied at input 1 is recovered. Following that is an FIFO memory 4 whose function is described in detail later. At block 5, the temporarily stored input signal is then subjected to a framing, and thereupon passes through two coders 6,7, e.g. a Reed-Solomon coder and a Viterbi-Trellis coder.

The output signal from coder 7 is written, using a clock pulse SR that corresponds to the symbol rate, into a filter 8. The modulated carrier wave is read out from filter 8 using a sampling rate SAR. Following that is a digital/analog converter 9 with an anti-aliasing filter 10. A clock signal having the sampling rate SAR is supplied to an input 11.

Modems of this type are usually designed for various symbol rates, the carrier frequency being changed accordingly. The transmitting-side section of a modem shown in FIG. 1 operates with asynchronous sampling, i.e. the sampling rate SAR is constant, so that even anti-aliasing filter 10 has a constant frequency limit. However, that is why a sampling-rate conversion is necessary, which is done, in a manner known per se, in filter 8, to which are supplied the output signals from coder 7 with an input clock pulse SR. Sampling clock pulse SAR is used for the readout from filter 8. For the sampling-rate conversion, an interpolation is carried out between the sampling values of the output signal of coder 7, the sampling values being weighted to the sampling values to be interpolated in conformance with the phase position of the new sampling value.

Original clock pulse IR contained in the input signals is not coupled to sampling clock pulse SAR. Framing circuit 5, coder 6 and coder 7 each add information to the in-going data stream, while the modulation on the basis of the symbol formation (QPSK: 2 bits; 8PSK: 3 bits, etc.) leads to a reduction in the clock-pulse rate. Therefore, in each case the data stream leaving one of these circuits has a different sampling rate than the data stream at the input. As input clock pulse, framing circuit 5 receives a clock pulse IR' which, averaged, has the frequency of input clock pulse IR, but which can fluctuate with respect to this short-term, which is why the signals are stored temporarily in an FIFO memory 4.

Framing circuit 5 receives a clock pulse CR (=composite rate), which is also used as the input clock pulse for coder 6. code 6, in turn, obtains clock pulse CCR (=coded composite rate) as the output clock pulse, with which the signals coded at 6 are then supplied to coder 7.

For generating the clock signals indicated, in the arrangement according to FIG. 1, provision is made for four numerically controlled oscillators (NCO) which are clocked with sampling clock pulse SAR supplied at 11. Each of these numerically controlled oscillators contains an accumulator formed from a register 12, 13, 14, 15 and an adder 16, 17, 18, 19, the accumulator, with each supplied clock pulse in common, adding a predefined value from a memory 20, 21, 22, 23 to the preceding value. Through the capacity of the accumulator and the value to be added in each case, a frequency division of clock pulse SAR results, the magnitude of the frequency division being definable by the respective value stored in memories 20 through 23.

A clock-pulse conversion corresponding to a PLL (phased-locked loop) function, which in each case interconnects an output clock pulse and an input clock pulse, is based essentially on two divisors L and M, which determine the ratio of the clock pulse conversion. In the following explanations, a module made up of filters 8 (FIG. 1), 34 (FIG. 2) and an associated clock-pulse generation, is called COVADI (complex variable decimator/interpolator).

From an input frequency $f_i$, an output frequency $f_o$ is expressed as:

$$f_o = L/M * f_i; \quad L<M \text{ is always assumed (L, M integral)}$$

In the case, for example, of a Reed-Solomon coding block 6, the divisor factors can vary within the range:

$$1<L, M<256.$$

If, in addition, there is a hash coding block 7 in the range of rate ½ to ⅞, for example, then the range of L and M expands by a factor of up to eight.

When a numerically controlled oscillator is used to clock filter 8, the converted clock pulse can be produced most simply by a second NCO function that is clocked in parallel and, thus, phase-rigidly coupled, using an increment $i_2$ corresponding to the conversion ratio.

The synchronism of the phase accumulators can be implemented simply in a synchronous digital system by processing both accumulators at the same time. The possible error propagation problem during the accumulation can be solved by the further developments mentioned at the outset, a variable phase increment along the lines of a three-step control being used in the exemplary embodiments according to FIGS. 1, 2 and 4.

This three-step control is based on three different values for a phase increment to be realized:

1. a nominal value $i_{nom}$ for the phase increment,
2. a value $i_{+\epsilon}$, which is slightly (approximately 0.5%) greater than the nominal value $i_{nom}$,
3. a value $i_{-\epsilon}$ which is slightly (approximately 0.5%) smaller than the nominal value $i_{nom}$.

The control provides that switching is performed back and forth among these three values of the phase increment, so that the required value for the increment results on average. For example, if the necessary value for the increment lies above the nominal value, the control assures that the greater value $i_{+\epsilon}$, is used on average more often than the smaller value $i_{-\epsilon}$.

A degree of freedom is the determination of these three values $i_{nom}$, $i_{+\epsilon}$, $i_{-\epsilon}$, such that quantization errors R for all necessary clock-pulse conversions are made without exception to zero. However, because of the virtual freedoom to select the three values $i_{nom}$, $i_{+\epsilon}$ and $i_{-\epsilon}$ within certain ranges, it is possible to achieve the following:

$$R_{nom}=R_{+\epsilon}=R_{-\epsilon}=0.$$

In the arrangement according to FIG. 1, three values of phase increment i for each of the clock pulses IR', CR, CCR and SR are stored in the respective memory 20 to 23. A phase-comparison circuit 24, with an adjacent low-pass filter 25, extracts a signal SEL, which in each case causes one of the values of the phase increments to be supplied to the adder in question.

In the following, the phase increments necessary for attaining the respective clock frequencies are calculated for various examples.

EXAMPLE 1: (b–24 bits)

Assumptions:

| | | | |
|---|---|---|---|
| Sampling rate SAR: | SAR = | 12.5 MHZ | (Input COVADI!) |
| Info rate IR: | IR = | 2.048 MHZ | (Standard-E1!) |
| Composite rate CR: | CR = | 2.144 MHZ | (Overhead rate: OR = 96 kHz) |
| Coded composite rate: | CCR = | 2.336 MHz | (RS-code rate: 201/219) |
| Symbol rate SR: | SR = | 1.55733 MHz | (FEC-rate: 3/4; QPSK-Mod.) |
| Double symbol rate: | DSR = | 3.11466 MHz | (Output COVADI!) |

Figure 2:
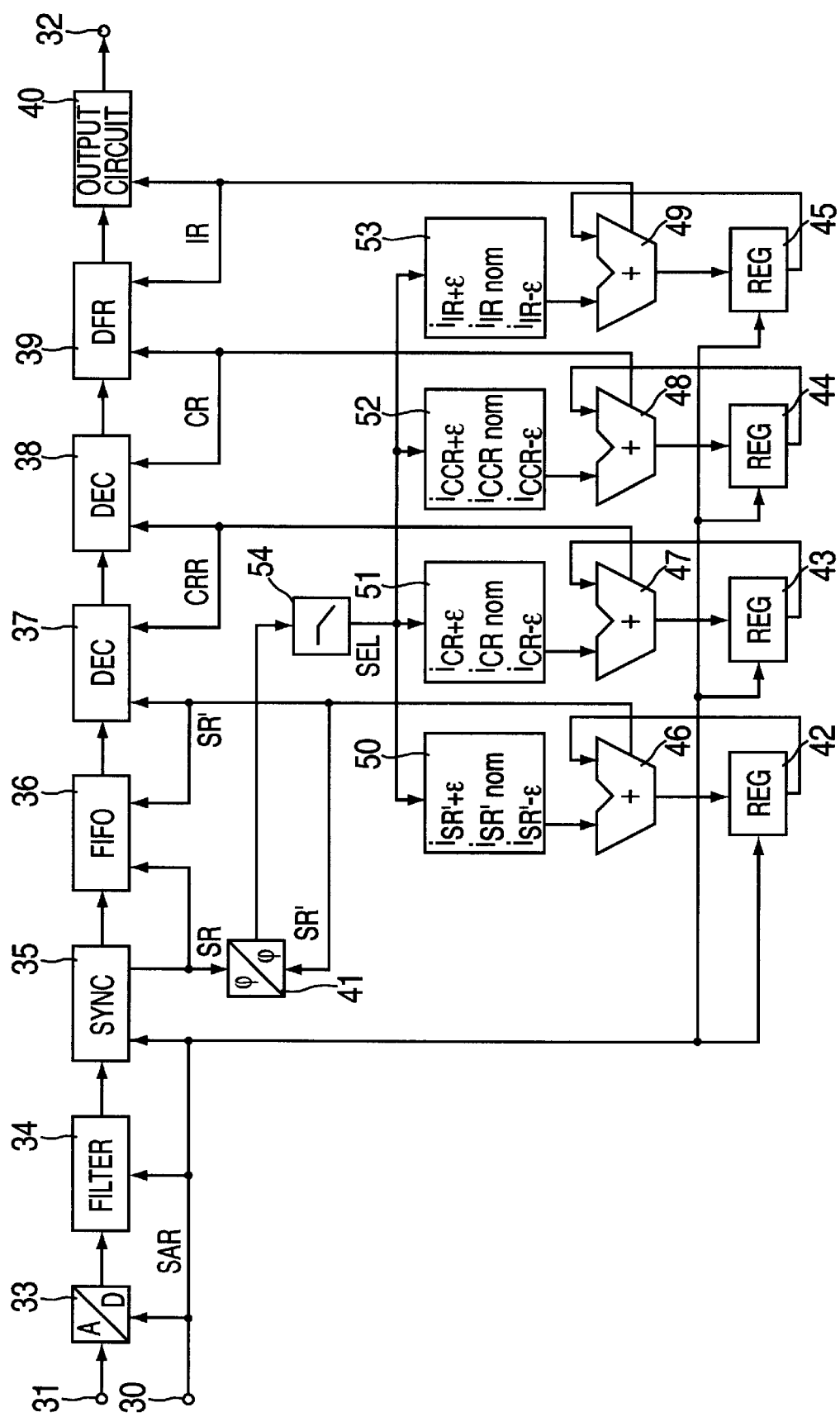
FIG. 2 shows an embodiment of the present invention associated with a receiving-side section of the modem.

The receiving side in FIG. 2 is to be considered. Given the above assumptions, a nominal decimation factor $d_{nom}$ is expressed as:

$$d_{nom}=SAR/DSR=4.013270548$$

This yields a nominal value $i_{nom}$ for the phase increment for generating the double symbol rate DSR of (assumption: b=24 bits):

$$i_{nom}=2^b * (d_{nom})^{-1}=0.249173333*2^{24}=4\,180\,434.835$$

Given an assumed deviation $\epsilon$ of ±0.5%, increments $i_{+\epsilon}$, and $i_{-\epsilon}$ are expressed as:

$$i_{+\epsilon}=i_{nom}(1+\epsilon)=0.250419200*2^{24}=4\,201\,337.009$$

and:

$$i_{-\epsilon}=i_{nom}(1-\epsilon)=0.247927466*2^{24}=4\,159\,532.661$$

Resulting finally after quantization to whole numbers is:

$$i_{nom}=4\,180\,435$$

$$i_{+\epsilon}=4\,201\,337$$

$$i_{-\epsilon}=4\,159\,533$$

These three values result initially without consideration of a clock-pulse conversion to be implemented with the aid of the virtual-PLL concept that is optimized with respect to outlay.

In a link-coded (e.g.chain-coded) system, as assumed in this example, the divisor factors of a PLL result multiplicatively from the individual conversion factors. In concrete terms, this means in the present example that:

The starting point is the double symbol rate DSR at the output of the COVADI module. A first conversion follows within the SYNC module to the symbol rate SR by the simple gating of each second strobe pulse of DSR in the SYNC.

SYNC divisor factors: $L_{SYNC}=1$; $M_{SYNC}=2$

The next conversion follows at Viterbi Decoder 7, where an FEC rate 3/4 is present; and also to be taken into account is that QFSK modulation exists, and thus 2 bits per symbol are transmitted.

$$(L_{FEC}/M_{FEC}=3/4*2/1-3/2)$$

FEC divisor factors: $L_{FEC}=3$; $M_{FEC}=2$

Following in the decoding chain is the Reed-Solomon decoding using an RS code rate of 201/219.

RS divisor factors: $L_{RS}=201$; $M_{RS}=219$

As a last step, the deframing is finally carried out on the receiving side using an ESC conversion rate which, for an info rate IR of 2.048 MHZ, is expressed as 2048/(2048+96).

ESC divisor factors: $L_{ESC}=2\ 048$; $M_{ESC}=2\ 144$

Thus, resulting for the conversion ratio of double symbol rate DSR to info rate IR at the output of the deframing unit is:

$$IR/DSR=(L_{SYNC}/M_{SYNC})*(L_{FEC}/M_{FEC})*(L_{RS}/M_{RS})*(L_{ESC}/M_{ESC})$$

$$IR/DSR=(1/2)*(3/2)*(201/219)*(2048/2144)$$

Resulting finally after the common divisors have been reduced as far as possible is:

$IR/DSR=48/73$ i.e. $L_{IR}=48$; $MR=73$

In this special case, comparatively small divisor factors result.

Resulting for the conversion ratio of DSR to composite rate CR is;

$$CR/DSR=(L_{SYNC}/M_{SYNC})*(L_{FEC}/M_{FEX})*(L_{RS}/M_{RS})$$

The result here after the common divisors have been reduced as far as possible is:

$CR/DSR=201/292$ i.e. $L_{CR}=201$; $M_{CR}=292$

Finally, resulting for the conversion ratio of DSR to coded composite rate CCR is:

$$CCR/DSR=(L_{SYNC}/M_{SYNC})*(L_{FEC}/M_{FEC})$$

$CCR/DSR=3/4$ i.e. $L_{CCR}=3$; $M_{CCR}=4$

At $M_{CR}=292$, the least common multiple of denominators M for all clock-pulse rates to be converted is at composite rate CR. The two other conversion ratios can be expanded accordingly, so that the denominator in each case is identical to $M_{CR}=292$. Thus, it follows that:

$IR/DSR=48/73=192/292$ $CR/DSR=201/292$ $CCR/DSR=3/4=219/292$

If the three phase increments $i_{nom}$, $i_{+\epsilon}$ and $i_{-\epsilon}$, are optimized, i.e. modified, so that all three are divisible by the denominator $M_{CR}=292$, then the optimized phase increments $i_{nom,opt}$, $i_{+\epsilon,opt}$ and $i_{-\epsilon,opt}$ result on the one hand, on the other hand, the condition $R_{nom}=M_{+\epsilon}=R_{-\epsilon}=0$ is also met.

In concrete terms, this means in the present example that:

| | | | | |
|---|---|---|---|---|
| $i_{nom}$ | = 4 180 435 | ⩾ | $i_{nom,opt}$ | = 4 180 564 |
| $i_{+\epsilon}$ | = 4 201 337 | ⩾ | $i_{+\epsilon,opt}$ | = 4 201 296 |
| $i_{-\epsilon}$ | = 4 159 533 | ⩾ | $i_{-\epsilon,opt}$ | = 4 159 540 |

Instead of the originally predefined deviation $\epsilon$ of $\pm 0.5\%$, resulting from the optimized increments $i_{nom,opt}$, $i_{+\epsilon,opt}$ and $i_{-\epsilon,opt}$ are the following deviations:

| | | | |
|---|---|---|---|
| $\epsilon_+ = +0.5\%$ | ⩾ | $\epsilon_{+,opt} = +0.496\%$ |
| $\epsilon_- = -0.5\%$ | ⩾ | $\epsilon_{-,opt} = -0.503\%$ |

In this connection, nominal value $i_{nom,opt}$ has also shifted with respect to $i_{nom}$ by a deviation $\delta$ of $\delta=+0.003\%$.

For the sake of completeness, the three phase increments are indicated in the following in each case for the individual clock-pulse conversions:

| | | |
|---|---|---|
| CCR: | CCR/DSR | = 219/292 |
| | $i_{CCR,nom,opt}$ | = 3 135 423 |
| | $i_{CCR,+\epsilon,opt}$ | = 3 150 972 |
| | $i_{CCR,-\epsilon,opt}$ | = 3 119 655 |
| CR: | CR/DSR | = 201/292 |
| | $1_{CR,nom,opt}$ | = 2 877 717 |
| | $1_{CR,+\epsilon,opt}$ | = 2 891 988 |
| | $1_{CR,-\epsilon,opt}$ | = 2 863 245 |
| IR | IR/DSR | = 192/292 |
| | $i_{IR,nom,opt}$ | = 2 748 864 |
| | $i_{IR,+\epsilon,opt}$ | = 2 762 496 |
| | $i_{IR,-\epsilon,opt}$ | = 2 735 040 |

When there are larger values for the largest occurring denominator M, and small values for the three phase increments $i_{nom}$, $i_{+\epsilon}$ and $i_{-\epsilon}$ (i.e. smaller data rates), an increasing discrepancy occurs between the predefined and actual discrepancies (accuracy problem!).

However, this does not constitute a fundamental problem, since increasing the word width b (above example was for b=24 bits) directly influences the inaccuracies. Increasing the word width b to, for example, b=32 bits is possible for the COVADI module without entailing additional expenditure for a redesign.

A further example is intended to assess the required word width b.

EXAMPLE 2: (b=32 bits)

Assumptions:

| | | | | |
|---|---|---|---|---|
| Sampling rate SAR: | SAR = | 12.5 | MHz | (Input COVADI!) |
| Info rate IR: | IR = | 8.448 | MHz | (Standard-E2!) |
| Composite rate CR: | CR = | 8.544 | MHz | (Overhead rate: OR = 96 kHz) |
| Coded composite rate: | CCR = | 9.27115 | MHz | (RS-code rate: 235/255) |
| Symbol rate SR: | SR = | 4.63557 | MHz | (FEC-rate: 2/3; 8-PSK-Mod.) |
| Double symbol rate: | DSR = | 9.27115 | MHz | (Output COVADI!) |

Given the above assumptions, a nominal decimation factor $d_{nom}$ is expressed as:

$d_{nom}=SAR/DSR=1.348268708$

This yields a nominal value i for the phase increment for generating the double symbol rate DSR of (assumption: b=32 bits):

$i_{nom}=2^{b}*(d_{nom})^{-1}=0.741691915*2^{32}=3\ 185\ 542\ 519,\ldots$

Given an assumed deviation $\epsilon$ of $\pm 0.5\%$, increments $i_{+\epsilon}$, and $i_{-\epsilon}$, are expressed as:

$i_{+\epsilon}=i_{nom}(1+\epsilon)=0.745400374*2^{32}=3\ 201\ 470\ 231,\ldots$ and:

$$i_{-\epsilon}=i_{nom}(1-\epsilon)=0.737983455*2^{32}=3\,169\,614\,806,\ldots$$

Resulting finally after quantization to whole numbers is:

$$i_{nom}=3\,185\,542\,519$$

$$i_{+\epsilon}=3\,201\,470\,231$$

$$i_{-\epsilon}=3\,169\,614\,806$$

These three values result initially without consideration of a clock-pulse conversion to be implemented with the aid of the virtual-PLL concept that is optimized with respect to outlay.

In a link-coded system, as assumed in this example, the divisor factors of a PLL result multiplicatively from the individual conversion factors. In concrete terms, this means in the present example that:

The starting point is the double symbol rate DSR at the output of the COVADI module. A first conversion follows within the SYNC module to the symbol rate SR by the simple gating of each second strobe pulse of DSR in the SYNC.

SYNC divisor factors: $L_{SYNC}=1$; $M_{SYNC}=2$

The next conversion follows at Trellis Decoder 7, where an FEC rate 2/3 is present; and also to be taken into account is that 8-PSK modulation exists, and thus 3 bits per symbol are transmitted.

$$(L_{FEC}/M_{FEC}=2/3*3/1=2/1)$$

FEC divisor factors: $L_{FEC}=2$; $M_{FEC}=1$

Following in the decoding chain is the Reed-Solomon decoding using an RS code rate of p235/255.

RS divisor factors: $L_{RS}=235$; $M_{RS}=255$

As a last step, the deframing is finally carried out on the receiving side using an ESC conversion rate which, for an info rate IR of 8.448 MHZ, is expressed as 8448/(8448 +96).

ESC divisor factors: $L_{ES}=8\,448$; $M_{ESC}=8\,544$

Thus, resulting for the conversion ratio of double symbol rate DSR to info rate IR at the output of the deframing unit is:

$$IR/DSR=(L_{SYNC}/M_{SYNC})*(L_{FEC}/M_{FEC})*(L_{RS}/M_{RS})*(L_{ESC}/M_{ESC})$$

$$IR/DSR=(1/2)*(2/1)*(235/255)*(8\,448/8\,544)$$

Resulting finally after the common divisors have been reduced as far as possible is:

$$IR/DSR=4\,136/4\,539 \text{ i.e. } L_{IR}=4\,136; M_{IR}=4\,539$$

In this special case, comparatively small divisor factors result. Resulting for the conversion ratio of DSR to composite rate CR is:

$$CR/DSR=(L_{SYNC}/M_{SYNC})*(L_{FEC}/M_{FEC})*(L_{RS}/M_{RS})$$

The result here after the common divisors have been reduced as far as possible is:

$$CR/DSR=47/51 \text{ i.e. } L_{CR}=47; M_{CR}=51$$

Finally, resulting for the conversion ratio of DSR to coded composite rate CCR is:

$$CCR/DSR=(L_{SYNC}/M_{SYNC})*(L_{FEC}/M_{FEC})$$

$$CCR/DSR=1/1 \text{ i.e. } L_{CCR}=1; M_{CCR}=1$$

At MIR=4539, the least common multiple of denominators M for all clock-pulse rates to be converted is at the info rate IR. The two other conversion ratios can be expanded accordingly, so that the denominator in each case is identical to $M_{IR}=4\,539$.

Thus, it follows that:

$$IR/DSR=4\,136/4\,539$$

$$CR/DSR=47/51=4\,183/4\,539$$

$$CCR/DSR=1/1=4\,539/4\,539$$

If the three phase increments $i_{nom}$, $i_{+\epsilon}$ and $i_{-\epsilon}$ are optimized, i.e. modified, so that all three are divisible by the denominator $M_{IR}=4,539$, then the optimized phase increments $i_{nom,opt}$, $i_{+\epsilon,opt}$ and $i_{-\epsilon,opt}$ result on the one hand, on the other hand, the condition $R_{nom}=R_{+\epsilon}=R_{-\epsilon}=0$ is also met.

In concrete terms, this means in the present example that:

| | | | | |
|---|---|---|---|---|
| $i_{nom}$ | = 3 185 542 519 | ≫ | $i_{nom,opt}$ | = 3 185 542 824 |
| $i_{+\epsilon}$ | = 3 201 470 231 | ≫ | $i_{+\epsilon,opt}$ | = 3 201 470 175 |
| $i_{-\epsilon}$ | = 3 169 614 806 | ≫ | $i_{-\epsilon,opt}$ | = 3 169 615 473 |

Instead of the originally predefined deviation $\epsilon$ of ±0.5%, resulting from the optimized increments $i_{nom,opt}$, $i_{+\epsilon,opt}$ and $i_{-\epsilon,opt}$ are the following deviations:

| | | |
|---|---|---|
| $\epsilon_+ = +0.5\%$ | ≫ | $\epsilon_{+,opt} = +0.499989\%$ |
| $\epsilon_- = -0.5\%$ | ≫ | $\epsilon_{-,opt} = -0.499989\%$ |

In this connection, nominal value $i_{nom,opt}$ has also shifted with respect to $i_{nom}$ by a deviation $\delta$ of $\delta=0.00001\%$.

For the sake of completeness, the three phase increments are indicated in the following in each case for the individual clock-pulse conversions:

| | | |
|---|---|---|
| CCR: | CCR/DSR | = 5 139/5 139 |
| | $i_{CCR,nom,opt}$ | = 3 185 542 824 |
| | $i_{CCR,+\epsilon,opt}$ | = 3 201 470 175 |
| | $i_{CCR,-\epsilon,opt}$ | = 3 169 615 473 |
| CR: | CR/DSR | = 4 183/4 539 |
| | $i_{CR,nom,opt}$ | = 2 935 696 328 |
| | $i_{CR,+\epsilon,opt}$ | = 2 950 374 475 |
| | $i_{CR,-\epsilon,opt}$ | = 2 921 018 181 |
| IR: | IR/DSR | = 4 136/4 539 |
| | $i_{IR,nom,opt}$ | = 2 902 710 976 |
| | $i_{IR,+\epsilon,opt}$ | = 2 917 224 200 |
| | $i_{IR,-\epsilon,opt}$ | = 2 888 197 752 |

EXAMPLE 3: (b=24 bits; otherwise like Example 2)

Assumptions:

| | | |
|---|---|---|
| Sampling rate SAR: | SAR = | 12.5 MHz (Input COVADI!) |
| Info rate IR: | IR = | 8.448 MHz (Standard-E2!) |

-continued

| Composite rate CR: | CR = 8.544 MHz | (Overhead rate: OR = 96 kHz) |
| Coded composite rate: | CCR = 9.27115 MHz | (RS-code rate: 235/255) |
| Symbol rate SR: | SR = 4.63557 MHz | (FEC-rate: 2/3; 8-PSK-Mod.) |
| Double symbol rate: | DSR = 9.27115 MHz | (Output COVADI!) |

Given the above assumptions, a nominal decimation factor $d_{nom}$ is expressed as:

$$d_{nom}=SAR/DSR=1.348268708$$

This yields a nominal value $i_{nom}$ for the phase increment for generating the double symbol rate DSR of (assumption: b=24 bits):

$$i_{nom}=2^{b}*(d_{nom})^{-1}=0.741691915*2^{24}=12\,443\,525.46$$

Given an assumed deviation $\delta$ of ±0.5%, increments $i_{+\epsilon}$ and $i_{-\epsilon}$ are expressed as:

$$i_{+\epsilon}=i_{nom}(1+\epsilon)=0.745400374*2^{24}=12\,505\,743.08$$

and:

$$i_{-\epsilon}=i_{nom}(1-\epsilon)=0.737983455*2^{24}=12\,381\,307.83$$

Resulting finally after quantization to whole numbers is:

$$i_{nom}=12\,443\,525$$

$$i_{+\epsilon}=12\,505\,743$$

$$i_{-\epsilon}=12\,381\,308$$

These three values result initially without consideration of a clock-pulse conversion to be implemented with the aid of the virtual-PLL concept that is optimized with respect to outlay.

In a link-coded system, as assumed in this example, the divisor factors of a PLL result multiplicatively from the individual conversion factors. In concrete terms, this means in the present example that:

The starting point is the double symbol rate DSR at the output of the COVADI module. A first conversion follows within the SYNC module to the symbol rate SR by the simple gating of each second strobe pulse of DSR in the SYNC.

SYNC divisor factors: $L_{SYNC}=1$; $M_{SYNC}=2$

The next conversion follows at the Trellis decoder, where an FEC rate 2/3 is present; and also to be taken into account is that 8-PSK modulation exists, and thus 3 bits per symbol are transmitted.

$$(L_{FEC}/M_{FEC}=2/3*3/1=2/1)$$

FEC divisor factors: $L_{FEC}=2$; $M_{FEC}=1$

Following in the decoding chain is the Reed-Solomon decoding using an RS code rate of 235/255.

RS divisor factors: $L_{RS}=235$; $M_{RS}=255$

As a last step, the deframing is finally carried out on the receiving side using an ESC conversion rate which, for an info rate IR of 8.448 MHz, is expressed as 8448/(8448+96).

ESC divisor factors: $L_{ESC}=8\,448$; $M_{ESC}=8\,544$

Thus, resulting for the conversion ratio of double symbol rate DSR to info rate IR at the output of the deframing unit is:

$$IR/DSR=(L_{SYNC}/M_{SYNC})*(L_{FEC}/M_{FEC})*(L_{RS}/M_{RS})*(L_{ESC}/M_{ESC})$$

$$IR/DSR=(1/2)*(2/1)*(235/255)*(8\,448/8\,544)$$

Resulting finally after the common divisors have been reduced as far as possible is:

$$IR/DSR=4\,136/4\,539\ \text{i.e.}\ L_{IR}=4\,136;\ M_{IR}=4\,539$$

In this special case, comparatively small divisor factors result.

Resulting for the conversion ratio of DSR to composite rate CR is:

$$CR/DSR=(L_{SYNC}/M_{SYNC})*(L_{FEC}/M_{FEC})*(L_{RS}/M_{RS})$$

The result here after the common divisors have been reduced as far as possible is:

$$CR/DSR=47/51\ \text{i.e.}\ L_{CR}=47;\ M_{CR}=51$$

Finally, resulting for the conversion ratio of DSR to coded composite rate CCR is:

$$CCR/DSR=(L_{SYNC}/M_{SYNC})*(L_{FEC}/M_{FEC})$$

$$CCR/DSR=1/1\ \text{i.e.}\ L_{CCR}=1;\ M_{CCR}=1$$

At $M_{IR}=4539$, the least common multiple of denominators M for all clock-pulse rates to be converted is at info rate IR. The two other conversion ratios can be expanded accordingly, so that the denominator in each case is identical to $M_{IR}=4\,539$.

Thus, it follows that:

$$IR/DSR=4\,136/4\,539$$

$$CR/DSR=47/51=4\,183/4\,539$$

$$CCR/DSR=1/1=4\,539/4\,539$$

If the three phase increments $i_{nom}$, $i_{+\epsilon}$ and $i_{-\epsilon}$ are optimized, i.e. modified, so that all three are divisible by the denominator $M_{IR}=4\,539$, then the optimized phase increments $i_{nom,opt}$, $i_{+\epsilon,opt}$ and $i_{-\epsilon,opt}$ result on the one hand, on the other hand, the condition $R_{nom}=R_{+\epsilon}=R_{-\epsilon}=0$ is also met.

In concrete terms, this means in the present example that:

| $i_{nom}$ | = 12 443 525 | ≫ | $i_{nom,opt}$ | = 12 441 399 |
| $i_{+\epsilon}$ | = 12 505 743 | ≫ | $i_{+\epsilon opt}$ | = 12 504 945 |
| $i_{-\epsilon}$ | = 12 381 308 | ≫ | $i_{-\epsilon opt}$ | = 12 382 392 |

Instead of the originally predefined deviation $\epsilon$ of ±0.5%, resulting from the optimized increments $i_{nom,opt}$, $i_{-\epsilon,opt}$ and $i_{-\epsilon,opt}$ are the following deviations:

| $\epsilon_+$ = +0.05% | ≫ | $\epsilon_{+,opt}$ = +0.511% |
| $\epsilon_-$ = −0.05% | ≫ | $\epsilon_{-,opt}$ = −0.474% |

In this connection, nominal value $i_{nom,opt}$ has also shifted with respect to $i_{nom}$ by a deviation $\delta$ of $\delta=-0.017\%$.

For the sake of completeness, the three phase increments are indicated in the following in each case for the individual clock-pulse conversions:

| CCR: | CCR/DSR | = 4 539/4 539 |
|---|---|---|
|  | $i_{CCR,nom,opt}$ | = 12 441 399 |
|  | $i_{CCR,+\epsilon,opt}$ | = 12 504 945 |
|  | $i_{CCR,-\epsilon,opt}$ | = 12 382 392 |
| CR: | CR/DSR | = 4 183/4 539 |
|  | $i_{CR,nom,opt}$ | = 11 465 603 |
|  | $i_{CR,+\epsilon,opt}$ | = 11 524 165 |
|  | $i_{CR,-\epsilon,opt}$ | = 11 411 224 |
| IR: | IR/DSR | = 4 136/4 539 |
|  | $i_{IR,nom,opt}$ | = 11 336 776 |
|  | $i_{IR,+\epsilon,opt}$ | = 11 394 680 |
|  | $i_{IR,-\epsilon,opt}$ | = 11 283 008 |

A further example is intended to show the influence of a small data rate on the parameters of the virtual PLL. The intention is also to define the word width b somewhat more exactly with this example.

EXAMPLE 4: (b=24 bits)

Assumptions:

| Sampling rate SAR: | SAR = | 2.5 MHz | (Input C)VADI!) |
|---|---|---|---|
| Info rate IR: | IR = | 64 kHz | (Smallest info rate USM9000!) |
| Composite rate CR: | CR = | 68.266 kHz | (Overhead IBS: QR = 1/15*IR) |
| Coded composite rate: | CCR = | 76.8 kHz | (RS-code rate: 112/126) |
| Symbol rate SR: | SR = | 51.2 kHz | (FEC-rate: 3/4; QPSK-Mod.) |
| Double symbol rate: | DSR = | 102.4 kHz | (Output COVADI!) |

Given the above assumptions, a nominal decimation factor $d_{nom}$ is expressed as:

$$d_{nom}=SAR/DSR=122.0703125$$

This yields a nominal value $i_{nom}$ for the phase increment for generating the double symbol rate DSR of (assumption: b=24 bits):

$$i_{nom}=2^{b}*(d_{nom})^{-1}=0.008192*2^{24}=137\ 438.9535$$

Given an assumed deviation $\epsilon$ of ±0.5%, the increments $i_{+\epsilon}$ and $i_{-\epsilon}$ are expressed as:

$$i_{+\epsilon}=i_{nom}(1+\epsilon)=0.00823296*2^{24}=138\ 126.1482$$

and:

$$i_{-\epsilon}=i_{nom}(1-\epsilon)=0.00815104*2^{24}=136\ 751.7587$$

Resulting finally after quantization to whole numbers is:

$$i_{nom}=137\ 439$$

$$i_{+\epsilon}=138\ 126$$

$$i_{-\epsilon}=136\ 752$$

These three values result initially without consideration of a clock-pulse conversion to be implemented with the aid of the virtual-PLL concept, optimized with respect to outlay.

In a link-coded system, as assumed in this example, the divisor factors of a PLL result multiplicatively from the individual conversion factors. In concrete terms, this means in the present example that:

The starting point is the double symbol rate DSR at the output of the COVADI module. A first conversion follows within the SYNC module to the symbol rate SR by the simple gating of each second strobe pulse of DSR in the SYNC.

SYNC divisor factors: $L_{SYNC}=1$; $M_{SYNC}=2$

The next conversion follows at the Viterbi decoder, where an FEC rate 3/4 is present; and also to be taken into account is that QPSK modulation exists, and thus 2 bits per symbol are transmitted.

$$(L_{FEC}/M_{FEC}=3/4*2/1*3/2)$$

FEC divisor factors: $L_{FEC}=3$; $M_{FEC}=2$

Following in the decoding chain is the Reed-Solomon decoding using an RS code rate of 112/126=8/9.

RS divisor factors: $L_{RS}=8$; $M_{RS}=9$

As a last step, the deframing is finally carried out on the receiving side using an ESC conversion rate which, for an IBS frame, is expressed as 15/16.

ESC divisor factors: $L_{ESC}=15$; $M_{FSC}=16$

Thus, resulting for the conversion ratio of double symbol rate DSR to info rate IR at the output of the deframing unit is:

$$IR/DSR=(L_{SYNC}/M_{SYNC})*(L_{FEC}/M_{FEC})*(L_{RS}/M_{RS})*(L_{ESC}/M_{ESC})$$

$$IR/DSR=(1/2)*(3/2)*(8/9)*(15/16)$$

Resulting finally after the common divisors have been reduced as far as possible is:

$$IR/DSR=5/8 \text{ i.e. } L_{IR}=5; M_{IR}=8$$

In this special case, comparatively small divisor factors result. This is because of the predefined RS code, which is predefined for all smaller info rates with the code rate 8/9.

Resulting for the conversion ratio of DSR to composite rate CR is:

$$CR/DSR=(L_{SYNC}/M_{SYNC})*(L_{FEC}/M_{PEC})*(L_{RS}/M_{RS})$$

The result here after the common divisors have been reduced as far as possible is:

$$CR/DSR=2/3 \text{ i.e. } L_{CR}=2; M_{CR}=3$$

Finally, resulting for the conversion ratio of DSR to coded composite rate CCR is:

$$CCR/DSR=(L_{SYNC}/M_{SYNC})*(L_{FEC}/M_{FEC})$$

$$CCR/DSR=3/4 \text{ i.e. } L_{CCR}=3; M_{CCR}=4$$

The least common multiple of denominators M for all clock-pulse rates to be converted is at M=24. The three conversion ratios can be expanded accordingly, so that the denominator in each case is identical to M=24.

Thus, it follows that:

$$IR/DSR=5/8 =15/24$$

$$CR/DSR=2/3 =16/24$$

$$CCR/DSR=3/4 =18/24$$

If the three phase increments $i_{nom}$, $i_{+\epsilon}$ and $i_{-\epsilon}$ are optimized, i.e. modified, so that all three are divisible by the denominator M=24, then the optimized phase increments $i_{nom,opt}$, $i_{+\epsilon,opt}$ and $i_{-\epsilon,opt}$ result on the one hand, on the other hand, the condition $R_{nom}=R_{+\epsilon}=R_{-\epsilon}=0$ is also met.

In concrete terms, this means in the present example that:

| | | | | |
|---|---|---|---|---|
| $i_{nom}$ | = 137 439 | ≫ | $i_{nom,opt}$ | = 137 448 |
| $i_{+\epsilon}$ | = 138 126 | ≫ | $i_{+\epsilon,opt}$ | = 138 120 |
| $i_{-\epsilon}$ | = 136 752 | ≫ | $i_{-\epsilon,opt}$ | = 136 752 |

Instead of the originally predefined deviation $\epsilon$ of ±0.5%, resulting from the optimized increments $i_{nom,opt}$, and $i_{-\epsilon,opt}$ are the following deviations:

| | | | | |
|---|---|---|---|---|
| $\epsilon_+$ | = +0.5% | ≫ | $\epsilon_{+,opt}$ | = +0.489% |
| $\epsilon_-$ | = −0.5% | ≫ | $\epsilon_{-,opt}$ | = −0.506% |

In this connection, nominal value inom,opt has also shifted with respect to inom by a deviation $\delta$ of $\delta$=±0.0065%.

For the sake of completeness, the three phase increments are indicated in the following in each case for the individual clock-pulse conversions:

| | | |
|---|---|---|
| CCR: | CCR/DSR | = 18/24 |
| | $i_{CCR,nom,opt}$ | = 103 086 |
| | $i_{CCR,+\epsilon,opt}$ | = 103 590 |
| | $i_{CCR,-\epsilon,opt}$ | = 102 564 |
| CR: | CR/DSR | = 16/24 |
| | $i_{CR,nom,opt}$ | = 91 632 |
| | $i_{CR,+\epsilon,opt}$ | = 92 080 |
| | $i_{CR,-\epsilon,opt}$ | = 91 168 |
| IR: | IR/DSR | = 15/24 |
| | $i_{IR,nom,opt}$ | = 85 905 |
| | $i_{IR,+\epsilon,opt}$ | = 86 325 |
| | $i_{IR,-\epsilon,opt}$ | = 85 470 |

A further example is intended to explain the application of the concept of virtual PLL on the transmitting side (FIG. 1).

EXAMPLE 5: (b=24 bits; like Example 4, however transmitting side)

Assumptions:

| | | | | |
|---|---|---|---|---|
| Sampling rate SAR: | SAR = | 12.5 | MHz | (Output COVADI!) |
| Info rate IR: | IR = | 64 | kHz | (Smallest info rate USM9000!) |
| Composite rate CR: | CR = | 68.266 | kHz | (Overhead IBS: OR = 1/15*IR) |
| Coded composite rate: | CCR = | 76.8 | kHz | (RS-code rate: 112/126) |
| Symbol rate SR: | SR = | 51.2 | kHz | (FEC-rate: 3/4; QPSK-Mod.) |
| Symbol rate SR: | SR = | 51.2 | kHz | (Input COVADI!) |

Given the above assumptions, a nominal decimation factor $d_{nom}$ is expressed as:

$d_{nom}$=SAR/SR=244.140625

This yields a nominal value $i_{nom}$ for the phase increment for generating the symbol rate SR of (assumption: b=24 bits):

$i_{nom}=2^{b}*(d_{nom})^{-1}=0.004096*2^{24}$=68 719.47674

Given an assumed deviation $\delta$ of ±0.5%, the increments $i_{+\epsilon}$ and $i_{-\epsilon}$ are expressed as:

$i_{+\epsilon}=i_{nom}(1+\epsilon)=0.00411648*2^{24}$≈69 063.07412 and:

$i_{-\epsilon}=i_{nom}(1-\epsilon)=0.00407552*2^{24}$=68 375.87935

Resulting finally after quantization to whole numbers is:

$i_{nom}$=68 719

$i_{+\epsilon}$=69 063

$i_{-\epsilon}$=68 376

These three values result initially without consideration of a clock-pulse conversion to be implemented with the aid of the virtual-PLL concept, optimized with respect to outlay.

In a link-coded system, as assumed in this example, the divisor factors of a PLL result multiplicatively from the individual conversion factors. In concrete terms, this means in the present example that:

The starting point is the symbol rate SR at the input of the COVADI module. A first conversion follows within the hash encoder, where an FEC rate 3/4 is present; and also to be taken into account is that QPSK modulation exists, and thus 2 bits per symbol are transmitted.

$(L_{FEC}/M_{FEC}=3/4*2/1*3/2)$

FEC divisor factors: $L_{FEC}$=3; $M_{FEC}$=2

Following in the encoding chain is the Reed-Solomon encoding using an RS code rate of 112/126=8/9.

RS divisor factors: $L_{RS}$=8; $M_{RS}$=9

As a last step coming up to the input interface, the deframing is finally carried out on the transmitting side using an ESC conversion rate which, for an IBS frame, is expressed as 15/16.

ESC divisor factors: $L_{ESC}$=15; $M_{ESC}$=16

Thus, resulting for the conversion ratio of symbol rate SR to info rate IR at the input of the framing unit is:

$IR/SR=(L_{FEC}/M_{FEC})*(L_{RS}/M_{RS})*(L_{ESC}/M_{ESC})$ $IR/SR=(3/2)*(8/9)*(15/16)$

Resulting finally after the common divisors have been reduced as far as possible is:

IR/SR=5/4 i. e. $L_{IR}$=5; $M_{IR}$=4

In this special case, comparatively small divisor factors result. This is because of the predefined RS code, which is predefined for all smaller info rates with the code rate 8/9.

Resulting for the conversion ratio of SR to composite rate CR is:

$CR/SR=(L_{FEC}/M_{FEC})*(L_{RS}/M_{RS})$

The result here after the common divisors have been reduced as far as possible is:

CR/SR=4/3 i.e. $L_{CR}$=4; $M_{CR}$=3

Finally, resulting for the conversion ratio of SR to coded composite rate CCR is:

$CCR/SR = (L_{FEC}/M_{FEC})$ $CCR/SR = 3/2$ i.e. $L_{CCR}=3; M_{CCR}=2$

The least common multiple of denominators M for all clock-pulse rates to be converted is at M=12. The three conversion ratios can be expanded accordingly, so that the denominator in each case is identical to M=12.

Thus, it follows that:

$IR/SR = 5/4 = 15/12$ $CR/SR = 4/3 = 16/12$ $CCR/SR = 3/2 = 18/12$

If the three phase increments $i_{nom}$, $i_{+\epsilon}$ and $i_{-\epsilon}$ are optimized, i.e. modified, so that all three are divisible by the denominator M=12, then the optimized phase increments $i_{nom,opt}$, $i_{+\epsilon,opt}$ and $i_{-\epsilon,opt}$ result on the one hand, on the other hand, the condition $R_{nom}=R_{+\epsilon}=R_{-\epsilon}=0$ is also met.

In concrete terms, this means in the present example that:

| | | | | |
|---|---|---|---|---|
| $i_{nom}$ | = 68 719 | ≫ | $i_{nom,opt}$ | = 68 724 |
| $i_{+\epsilon}$ | = 69 063 | ≫ | $i_{+\epsilon,opt}$ | = 69 060 |
| $i_{-\epsilon}$ | = 68 376 | ≫ | $i_{-\epsilon,opt}$ | = 68 376 |

Instead of the originally predefined deviation $\epsilon$ of ±0.5%, resulting from the optimized increments $i_{nom,opt}$, $i_{+\epsilon,opt}$ and $i_{-\epsilon,opt}$ are the following deviations:

| | | | | |
|---|---|---|---|---|
| $\epsilon_+ = +0.5\%$ | | ≫ | $\epsilon_{+,opt}$ | = +0.489% |
| $\epsilon_- = -0.5\%$ | | ≫ | $\epsilon_{-,opt}$ | = -0.506% |

In this connection, nominal value $i_{nom,opt}$ has also shifted with respect to $i_{nom}$ by a deviation $\delta$ of $\delta=+0.0073\%$.

For the sake of completeness, the three phase increments are indicated in the following in each case for the individual clock-pulse conversions:

| | | |
|---|---|---|
| CCR: | CCR/SR | = 18/12 |
| | $i_{CCR,nom,opt}$ | = 103 086 |
| | $i_{CCR,+\epsilon,opt}$ | = 103 590 |
| | $i_{CCR,-\epsilon,opt}$ | = 102 564 |
| CR: | CR/DSR | = 16/12 |
| | $i_{CR,nom,opt}$ | = 91 632 |
| | $i_{CR,+\epsilon,opt}$ | = 92 080 |
| | $i_{CR,-\epsilon,opt}$ | = 91 168 |
| IR: | IR/DSR | = 15/12 |
| | $i_{IR,nom,opt}$ | = 85 905 |
| | $i_{IR,+\epsilon,opt}$ | = 86 325 |
| | $i_{IR,-\epsilon,opt}$ | = 85 470 |

Examples 1 through 5 show that phase increments can be calculated with sufficient accuracy for various clock-frequency combinations. In addition, the examples show that a word width b of b=24 bits is sufficient in many cases.

FIG. 2 shows the receiving-side section of a modem with a device for extracting clock pulses according to the present invention. The received signal is supplied to an input 31. The demodulated and decoded signal can be taken from an output 32. The received signal, after analog/digital conversion at 33, is conducted via a filter 34 and reaches synchronization circuit 35. These circuits are operated with a sampling clock pulse SAR supplied at 30. Extracted in synchronization circuit 35 from the received signal is a symbol clock pulse SR which is supplied to a phase-comparison circuit 41.

After synchronization circuit 35, the received signal passes through an FIFO memory 36, two decoders 37, 38, a deframing circuit 39, and an output circuit 40. Four accumulators, each made up of a register 42, 43, 44, 45 and an adder 46, 47, 48, 49 are provided for forming the clock signals CCR, CR and IR, as well as a clock signal SR' to be compared to the symbol clock signal SR. In each case, three phase increments are stored in each memory 50, 51, 52, 53. Which of the three phase increments is read out from memory 50 to 53 and supplied to the respective adder 46 to 49 is determined from signal SEL, which is extracted from the result of the phase comparison at 41 with the aid of a low-pass filter 54.

Figure 3:
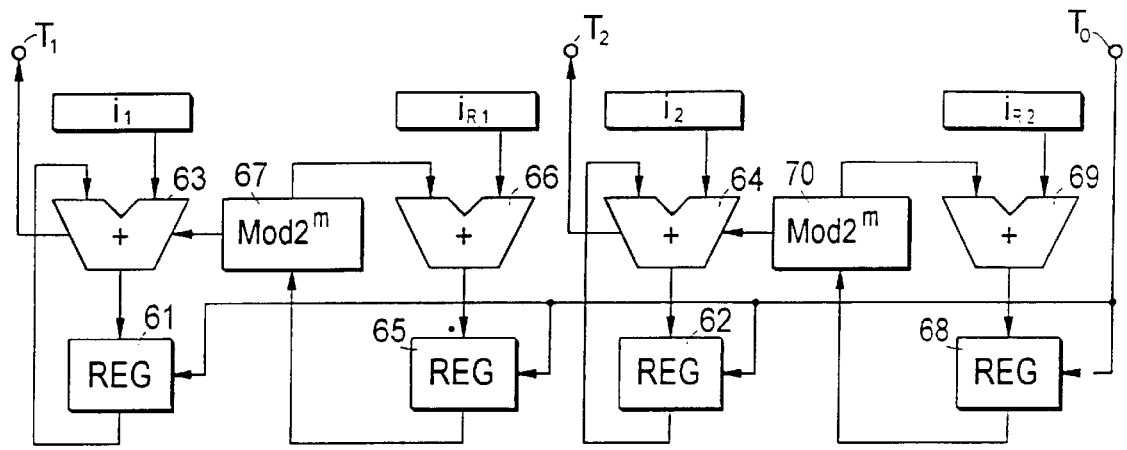
FIG. 3 shows another embodiment according to the present invention.

FIG. 3 shows a further embodiment for avoiding an error propagation. With the aid of the circuit arrangement shown in FIG. 3, two clock pulses $T_1$ and $T_2$ are extracted from a clock pulse $T_0$, for which purpose the content of two accumulators, each including a register 61, 62 and an adder 63, 64, is incremented with each clock pulse $T_0$ by a phase increment $i_1$ and $i_2$, respectively. Phase increments $i_1$, and $i_2$, in relation to the accumulator capacity, determine the frequency ratio of extracted clock pulses $T_1$, and $T_2$ to supplied clock pulse $T_0$, the ratio of the capacity of the respective register to the respective phase increment not being integral. The arrangement according to FIG. 3 prevents error propagation, in that, synchronously with accumulators 61, 63 or 62, 64, in each case a further accumulator 65, 66 or 68, 69 is clocked by clock pulse $T_0$, which accumulates a remaining error $i_{R,1}$ and $i_{R,2}$, respectively. The modulo$2^m$ is formed at 67 or 70 from the respective accumulator content, and is supplied as carry to the respective adder 63 or 64.

Figure 4:
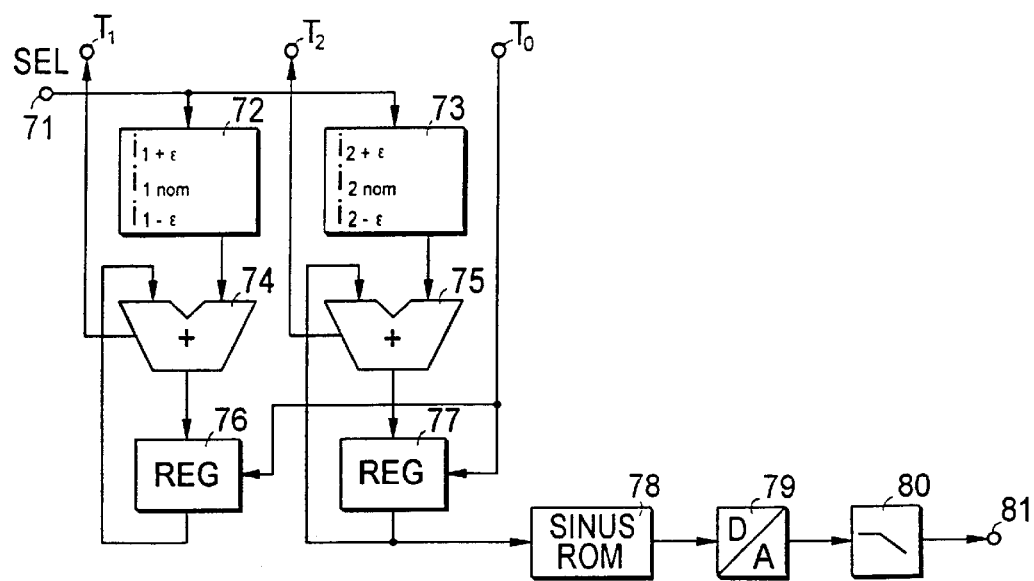
FIG. 4 shows yet another embodiment according to the present invention including an additional device for generating a jitter-free clock signal.

The arrangement according to FIG. 4 is likewise used to extract two clock signals $T_1$, and $T_2$ from supplied clock signal $T_0$. To avoid error propagation, one phase increment of three stored at any one time in memories 72, 73 is supplied in each case to an adder 74, 75 as a function of a signal SEL supplied at 71. The respective accumulated value is stored in each case in a register 76, 77. In the case of clock signal $T_2$, the register content is fed additionally to a sine ROM 78, from which a digital sine signal is able to be read out corresponding to the supplied values. This signal is sent via a digital/analog converter 79 to an anti-aliasing filter 80, at whose output 81 a jitter-free sine signal is present, from which a jitter-free clock signal can be extracted by zero-crossing detection.

What is claimed is:

1. A method for extracting a plurality of clock signals for at least one signal-processing circuit from a first clock signal, comprising the steps of:

accumulating, using at least one first accumulator, a stored data word in a clock pulse of the first clock signal, the at least one first accumulator having a first predetermined bit length (n), wherein n is a natural number;

during the accumulating step, performing a modulo$2^n$ operation using the at least one first accumulator;

providing a second clock signal;

modifying the stored data word as a function of a phase position of the second clock signal in relation to one of the plurality of clock signals;

storing a plurality of predetermined values for the stored data word in a memory unit;

selecting a particular value from the plurality of predetermined values, as a function of the phase position, to be the stored data word;

accumulating, using at least one second accumulator, remainder values in the clock pulse of the first clock signal, the at least one second accumulator having a second predetermined bit width (m) and a numerical range of at least one element of, wherein m is a natural number;

after a modulo$2^m$ formation, providing contents of the at least one second accumulator to a carry-over input of the at least one first accumulator for extracting the first clock signal; and forming the plurality of clock signals from at least one output signal of the at least one first accumulator.

2. The method according to claim 1, wherein the at least one signal-processing circuit includes a digital modem.

3. The method according to claim 1, wherein the predetermined values include three predetermined values.

4. The method according to claim 1, wherein at least one of the plurality of clock signals is formed from an overflow of the at least one first accumulator.

5. The method according to claim 1, wherein at least one of the plurality of clock signals is formed using:

a sinusoidal formation of the contents of the at least one second accumulator, a digital/analog conversion, an analog filtering according to a sampling theorem, and a zero-crossover detection.

6. The method according to claim 1, wherein the at least one first accumulator includes a plurality of first accumulators, and wherein each of the plurality of clock signals is formed from the at least one output of a single one of the plurality of first accumulators.

7. A method for extracting a plurality of clock signals for at least one signal-processing circuit from a first clock signal, comprising the steps of:

accumulating, using at least one accumulator, a stored data word in a clocked pulse of the first clock signal, the at least one accumulator having a predetermined bit length (n), wherein n is a natural number;

during the accumulating step, performing a modulo$2^n$ operation using the at least one accumulator;

providing a second clock signal;

modifying the stored data word as a function of a phase position of the second clock signal in relation to one of the plurality of clock signals;

storing a plurality of predetermined values for the stored data word in a memory unit;

selecting a particular value from the plurality of predetermined values, as a function of the phase position, to be the stored data word, wherein the stored data word to be accumulated by the at least one accumulator is divisible, without generating a remainder and within a numerical range representable by a predetermined word width, by a largest common divisor of all clock-signal conversion ratios to be implemented; and forming the plurality of clock signals from at least one output signal of the at least one accumulator.

8. The method according to claim 7, wherein the at least one signal-processing circuit includes a digital modem.

9. The method according to claim 7, wherein the predetermined values include three predetermined values.

10. The method according to claim 7, wherein at least one of the plurality of clock signals is formed from an overflow of the at least one accumulator.

11. The method according to claim 7, wherein at least one of the plurality of clock signals is formed using:

a sinusoidal formation of contents of the at least one accumulator, a digital/analog conversion, an analog filtering according to a sampling theorem, and a zero-crossover detection.

12. The method according to claim 7, wherein the at least one accumulator includes a plurality of first accumulators, and wherein each of the plurality of clock signals is formed from the at least one output of a single one of the plurality of accumulators.

13. An arrangement for extracting a plurality of clock signals in a digital modem, comprising:

an intermediate memory device;

a plurality of signal-processing circuits, the intermediate memory device and the signal-processing circuits providing a digital signal;

a variable interpolation device receiving the digital signal and outputting a modulated carrier signal having a first clock signal, wherein a second clock signal is extracted from the digital signal;

a first accumulator associated with an output of the intermediate memory device; and at least one second accumulator associated with the signal-processing circuits, the first and second accumulators having a predetermined bit width and providing the plurality of clock signals, wherein at least one of the first and second accumulators accumulates a current data word in a clock pulse of the first clock signal, the current data word being an incremental value of a previous data word in a respective one of the first and second accumulators, and wherein the current data word for at least one of the first and second accumulators is modified as a function of a phase position of the second clock signal in relation to one of the plurality of clock signals.

14. The arrangement according to claim 13, wherein the signal-processing circuits include coders.

15. The arrangement according to claim 13, further comprising:

a plurality of further memory devices, each of the further memory device associated with a respective one of the first and second accumulators and storing a plurality of predetermined values for the current data word of the respective one of the first and second accumulators, wherein a particular value from the plurality of predetermined values is selected, as a function of the phase position, to be the current data word.

16. The arrangement according to claim 13, wherein the current data word is selected from three predetermined values.

17. An arrangement for extracting clock signals in a digital modem via an output unit, comprising:

a variable decimation device receiving a modulated carrier signal and outputting a digital signal, the variable decimation device receiving a first clock signal;

an intermediate memory device;

a plurality of signal-processing circuits, the output unit receiving the digital signal via the intermediate memory device and the signal-processing circuits, wherein a second supplied clock signal is extracted from the digital signal;

a first accumulator associated with an output of the intermediate memory device; and at least one second accumulator associated with the signal-processing circuits, the first and second accumulators having a predetermined bit width and providing the plurality of clock signals, wherein at least one of the first and second accumulators accumulates a current data word in a clock pulse of the first clock signal, the current data word being an incremental value of a previous data word in a respective one of the first and second accumulators, and wherein the current data word is modified as a function of a phase position of the second clock signal in relation to one of the plurality of clock signals.

18. The arrangement according to claim 17, wherein the signal-processing circuits include coders.

19. The arrangement according to claim 17, further comprising:

a plurality of further memory devices, each of the further memory device associated with a respective one of the first and second accumulators and storing a plurality of predetermined values for the current data word of the respective one of the first and second accumulators, wherein a particular value from the plurality of predetermined values is selected as a function of the phase position to be the current data word.

20. The arrangement according to claim 19, wherein the current data word is selected from three predetermined values.

* * * * *

UNITED STATES PATENT AND TRADEMARK OFFICE
CERTIFICATE OF CORRECTION

PATENT NO. : 6,259,727 B1
DATED : July 10, 2001
INVENTOR(S) : Auer, Erich

It is certified that error appears in the above-identified patent and that said Letters Patent is hereby corrected as shown below:

<u>Title page, Item [54] and Column 1, lines 1-3,</u>
Change the title to read -- METHOD AND ARRANGEMENT FOR EXTRACTING A PLURALITY OF CLOCK SIGNALS --

<u>Column 4,</u>
Line 49, change "code 6" to -- Coder 6 --

<u>Column 5,</u>
Line 52, change "Freedoom" to -- Freedom --

<u>Column 8,</u>
Line 58, change "i" to -- $i_{nom}$ --
Line 64, change "∈of" to -- ∈ of --
Line 64, change "$i_{+∈}$." to -- $i_{+∈}$ --
Line 65, change "$i_{-∈}$," to -- $i_{-∈}$ --

<u>Column 9,</u>
Line 35, change "p235/255" to -- 235/255 --
Line 43, change "$L_{ES}$" to -- $L_{ESC}$ --

<u>Column 10,</u>
Line 31, change "∈of" to -- ∈ of --
Line 41, change "δof" to -- δ of --

<u>Column 11,</u>
Line 21, change "δof" to -- ∈of --
Line 21, change "$i_{+∈and}\, i_{-∈}$" to -- $i_{+∈}$ and $i_{-∈}$ --
Line 22, change "$i_{-∈}$are" to -- $i_{-∈}$ are --

<u>Column 12,</u>
Line 44, change "$i_{+∈}$and" to -- $i_{+∈}$ and --
Line 44, change "$i_{-∈}$are" to -- $i_{-∈}$ are --
Line 57, change "∈of" to -- ∈ of --
Line 67, change "δof" to -- δ of --

UNITED STATES PATENT AND TRADEMARK OFFICE
CERTIFICATE OF CORRECTION

PATENT NO. : 6,259,727 B1
DATED : July 10, 2001
INVENTOR(S) : Auer, Erich

It is certified that error appears in the above-identified patent and that said Letters Patent is hereby corrected as shown below:

Column 13,
Line 48, change "$\in$of" to -- $\in$ of --
Line 49, change "$i_{+\in}$and $i_{-\in}$are" to -- $i_{+\in}$ and $i_{\in}$ are --

Column 15,
Line 1, change "$i_{+\in}$and $i_{-\in}$are" to -- $i_{+\in}$ and $i_{\in}$ are --
Line 14, change "$\in$of" to -- $\in$ of --
Line 23, change "inom,opt" to -- $i_{nom,opt}$ --
Line 24, change "inom" to -- $i_{nom}$ --

Column 16,
Line 1, change "$\delta$of" to -- $\delta$ of --
Line 2, change "$i_{+\in}$and $i_{-\in}$are" to -- $i_{+\in}$ and $i_{\in}$ are --

Column 17,
Line 15, change "$i_{+\in}$and $i_{-\in}$are" to -- $i_{+\in}$ and $i_{\in}$ are --
Line 28, change "$\in$of" to -- $\in$ of --
Line 38, change "$\delta$of" to -- $\delta$ of --

Signed and Sealed this

Twenty-second Day of July, 2003

JAMES E. ROGAN
*Director of the United States Patent and Trademark Office*